(12) United States Patent
Okatake et al.

(10) Patent No.: US 9,063,198 B2
(45) Date of Patent: Jun. 23, 2015

(54) CURRENT SENSOR HAVING SELF-DIAGNOSIS FUNCTION AND SIGNAL PROCESSING CIRCUIT

(71) Applicant: Asahi Kasei Microdevices Corporation, Tokyo (JP)

(72) Inventors: Shigeki Okatake, Tokyo (JP); Takenobu Nakamura, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 121 days.

(21) Appl. No.: 13/777,005

(22) Filed: Feb. 26, 2013

(65) Prior Publication Data

US 2013/0222001 A1 Aug. 29, 2013

(30) Foreign Application Priority Data

Feb. 29, 2012 (JP) ................. 2012-044059
Dec. 5, 2012 (JP) ................. 2012-266317

(51) Int. Cl.
*G01R 31/00* (2006.01)
*G01R 31/3187* (2006.01)
(Continued)

(52) U.S. Cl.
CPC .......... *G01R 31/3187* (2013.01); *G01R 35/005* (2013.01); *G01R 15/202* (2013.01)

(58) Field of Classification Search
CPC . G01R 31/3187; G01R 35/005; G01R 15/202
USPC ......... 324/500, 522, 750.3, 207.13, 200, 234, 324/239, 241, 713; 331/16, 10, 11, 14, 175; 714/732–737; 327/524, 72–74, 77, 87, 327/50, 590, 551–553
See application file for complete search history.

(56) References Cited

U.S. PATENT DOCUMENTS 5,065,088 A * 11/1991 Habiro et al. ............. 324/117 H
5,483,394 A * 1/1996 Harman .................. 360/77.12
(Continued)

FOREIGN PATENT DOCUMENTS

JP        2012-063246        3/2012

OTHER PUBLICATIONS

Popovic, Hall Effect Devices, ISBN 0-7503-0096-5, Inst of Physics Pub Inc. pp. 186-191, (May 1991).
(Continued)

*Primary Examiner* — Melissa Koval
*Assistant Examiner* — Trung Nguyen
(74) *Attorney, Agent, or Firm* — Morgan, Lewis & Bockius LLP

(57) ABSTRACT

There are provided a current sensor which has a self-diagnosis function and a signal processing circuit. The current sensor is provided with an offset component output circuit 102 which extracts an offset component from an output signal of a Hall element 101 which includes a signal component and an offset component, a reference signal generator 103 which outputs a reference signal, and an error signal generation circuit 104 which generates an error signal based on an offset component which the offset component output circuit 102 outputs and a reference signal. The offset component output circuit 102 is provided with a signal amplification circuit 106 which amplifies the output of the Hall element 101 and outputs an output signal and offset component to a low frequency component and the other to a ripple component.

19 Claims, 11 Drawing Sheets

(51) Int. Cl.
*G01R 15/20* (2006.01)
*G01R 35/00* (2006.01)

(56) References Cited

U.S. PATENT DOCUMENTS

| | | |
|---|---|---|
| 6,674,322 B2 | 1/2004 | Motz |
| 7,492,149 B2 | 2/2009 | Motz et al. |
| 2007/0294046 A1 * | 12/2007 | Browning et al. ............. 702/99 |

OTHER PUBLICATIONS

Bilotti et al., Monolithic Magnetic Hall Sensor Using Dynamic Quadrature Offset Cancellation, IEEE Journal of Solid State Circuits, vol. 32, pp. 829-836, Jun. 1997.

Japanese Office Action dated Jul. 22, 2014 in corresponding Japanese Patent Application No. 2012-266317 along with partial English translation of the Office Action.

* cited by examiner

WHEN CHOPPER CLOCK PHASE IS φ1
AND DRIVE DIRECTION OF HALL
ELEMENT IS 0 DEGREES

WHEN CHOPPER CLOCK PHASE IS φ2
AND DRIVE DIRECTION OF HALL
ELEMENT IS 90 DEGREES

DIRECTION OF MAGNETIC FIELD
WHICH IS DETECTED BY HALL
ELEMENT IS VERTICAL TO PAPER
SURFACE

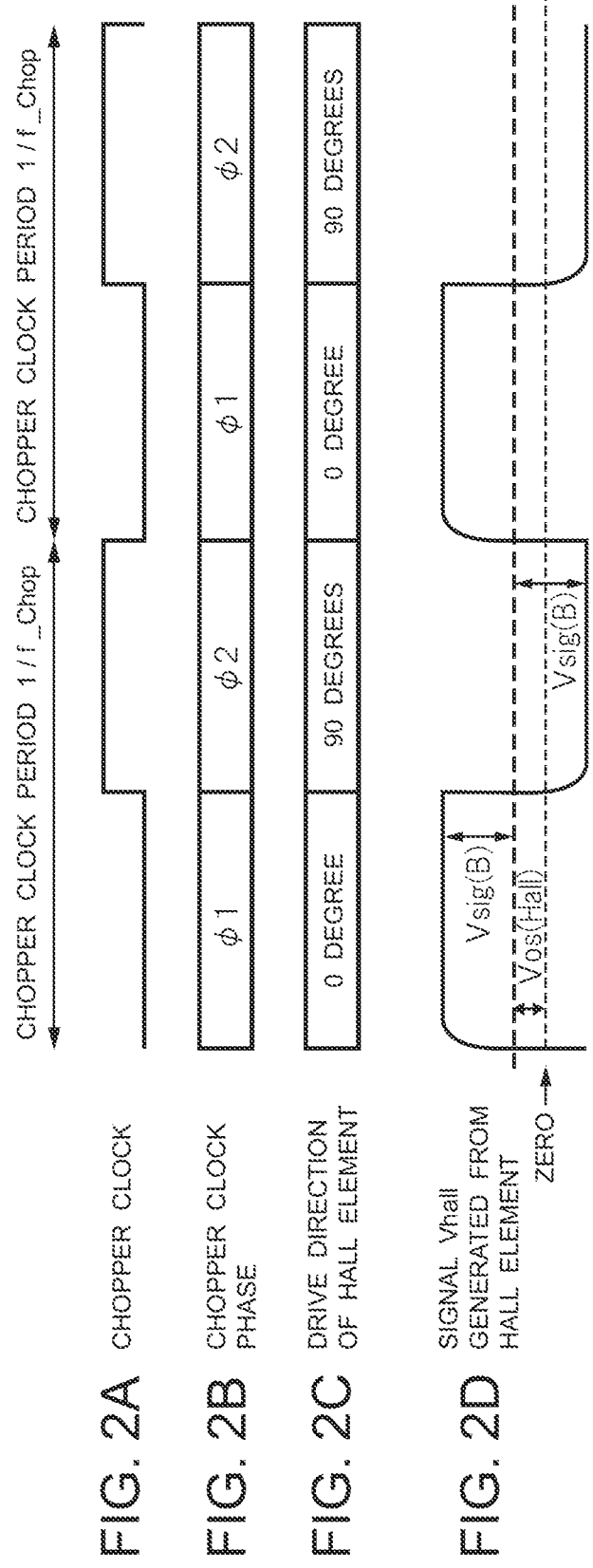

FIG. 9A CHOPPER CLOCK

FIG. 9B CHOPPER CLOCK PHASE

FIG. 9C CHOPPER CLOCK COUNTER VALUE "i"

VALUE X(i) OF SERVO VARIABLE

FIG. 9D RIPPLE-LIKE NOISE GENERATED AT OUTPUT VOLTAGE Vout OF SIGNAL AMPLIFIER

SIGNAL COMPONENT Vsig(B) CORRESPONDING TO MAGNETIC FIELD B BEING DETECTED

CURRENT SENSOR HAVING SELF-DIAGNOSIS FUNCTION AND SIGNAL PROCESSING CIRCUIT

TECHNICAL FIELD

The present invention relates to a current sensor which has a self-diagnosis function and a signal processing circuit, more particularly relates to a current sensor which has a self-diagnosis function and signal processing circuit which can detect a fault in the state where a magnetic sensor is operating.

BACKGROUND ART

In general, a magnetic sensor which uses a Hall element is not only used as a proximity sensor, linear position sensor, rotational position sensor, etc. as a sensor for detecting positional information of a magnet, but is also widely utilized as a current sensor which detects the magnetic field which is created by the current flowing through a current conductor so as to measure the amount of current which flows through the current conductor by contactless means.

In particular, in a current sensor which is utilized for detecting an inverter current of a motor, it is demanded to detect the inverter current, which is switched at a high frequency, with high precision for the purpose of increasing the efficiency of motor control.

This type of Hall element has a magneto-electric conversion function which generates a Hall electromotive force signal in accordance with the intensity of the magnetic field which is input to the Hall element, so is being broadly used as a magnetic sensor. However, a Hall element has an offset voltage and this offset leads to a not-zero finite voltage being output even in a zero magnetic field state, that is, in the absence of a magnetic field.

Therefore, in a magnetic sensor which utilizes a Hall element, there is the method of driving the Hall element, known as the "spinning current method" or "connection commutation method", for the purpose of cancelling out the offset voltage of the Hall element. This method comprises the operation of periodically switching between the position of a terminal pair for injecting a drive current to the Hall element and the position of a terminal pair for detecting the Hall electromotive force signal in accordance with a clock called a "chopper clock" (for example, see Non-Patent Document 1).

The spinning current method designed for the cancellation of this offset voltage can be realized by using a switch circuit in a CMOS semiconductor circuit as well, so a Hall electromotive force detection circuit for realizing a high precision magnetic sensor is generally provided with a switch circuit for realizing the spinning current method.

Moreover, the Hall electromotive force signal which is generated in a Hall element is generally weak, so for the purpose of amplifying this Hall electromotive force signal, a Hall electromotive force signal detection circuit is a circuit which includes a signal amplification circuit. Here, when this signal amplification circuit has a finite offset voltage, the offset voltage of the signal amplification circuit must also be cancelled.

Under these circumstances, for a Hall electromotive force signal detection circuit which detects the Hall electromotive force which is generated by a Hall element and amplifies the signal, the circuit configuration of a signal amplification circuit which uses a current feedback type amplification circuit suitable for the combination with the spinning current method of a Hall element is known. In this current feedback type amplification circuit, a circuit configuration which uses a chopper clock to modulate the offset voltage of the amplification circuit to the frequency of the chopper clock is a circuit configuration which is generally known as a "chopper amp".

As explained above, if using a Hall electromotive force detection circuit which combines the circuit configuration of a circuit which realizes the spinning current method in the Hall element and a chopper amp in a signal amplification circuit, it is known that it is possible to modulate both the offset voltage of the Hall element and the offset voltage of the signal amplification circuit at the frequency of the chopper clock (for example, see Patent Document 1 and Non-Patent Document 2).

Below, the cancellation of the offset of a Hall element by the spinning current method will be explained.

FIGS. 1A and 1B illustrate the detection of a Hall electromotive force when changing the direction of the drive current which biases the Hall element between 0 degree and 90 degrees each time the phase of the chopper clock switches between the binary values of $\phi 1$, $\phi 2$. FIG. 1A illustrates the detection of the Hall electromotive force when the phase of the chopper clock is $\phi 1$ and the direction of the drive current of the Hall element is 0 degree. FIG. 1B illustrates the detection of the Hall electromotive force when the phase of the chopper clock is $\phi 2$ and the direction of the drive current of the Hall element is 90 degrees. Note that, the Hall element is modeled as a four-terminal element which is comprised of four resistors and is driven by a constant current.

In FIGS. 1A and 1B, when the direction of the drive current of the Hall element is switched between 0 degree and 90 degrees, the voltage signals Vhall($\phi 1$) and Vhall($\phi 2$) measured at the Hall element are, as shown in Formula 1, expressed as the sum of the Hall electromotive force signal Vsig(B) in accordance with the magnetic field B which is detected by the magnetic sensor using the Hall element and the offset voltage Vos(Hall) of the Hall element.

Here, by periodically switching the direction of the bias current of the Hall element in accordance with the chopper clock between 0 degree and 90 degrees, it is possible to switch the polarity of the Hall electromotive force signal Vsig(B) corresponding to the magnetic field being detected between inverted/noninverted, so it is possible to modulate the Hall electromotive force signal Vsig(B) corresponding to the magnetic field being detected to the frequency f_chop of the chopper clock. On the other hand, regarding the DC offset voltage Vos(Hall) of the Hall element, when the direction of the drive current of the Hall element is switched between 0 degree and 90 degrees, the DC offset has the same polarity, so Vos(Hall) is not modulated in frequency domain to the chopper clock.

Signal generated at Hall element     Formula 1

$$\begin{cases} Vhall(\phi 1) = +Vsig(B) + Vos(\text{Hall}) & (\text{when chopper clock} = \varphi 1) \\ Vhall(\phi 2) = -Vsig(B) + Vos(\text{Hall}) & (\text{when chopper clock} = \varphi 2) \end{cases}$$

As explained above, when performing an operation of switching the direction of the drive current of a Hall element in accordance with a chopper clock between 0 degree and 90 degrees, the signal Vhall which is generated at the Hall element becomes a waveform such as shown in FIGS. 2A to 2D. Moreover, the spectrum of the signal which is generated at the Hall element becomes the spectrum such as shown in FIG. 3, so it will be understood that the Hall electromotive force signal Vsig(B) according to the magnetic field which is being detected and the offset voltage Vos(Hall) of the Hall element are separated in the frequency domain. This is the principle of the cancellation of the offset by the spinning current method.

In the explanation given above, the direction of the drive current of a Hall element with four terminals is switched between 0 degree and 90 degrees. However, it should be noted that the separation of the Hall electromotive signal and the offset voltage in the frequency domain is also possible when the direction of the drive current of the Hall element is periodically selected among 0 degree, 90 degrees, 180 degrees, and 270 degrees.

The Hall electromotive force signal Vsig(B) which is modulated by the frequency f_chop of the chopper clock as explained this way is demodulated using the chopper clock in the later stage of the Hall electromotive force signal detection circuit. As a result of this demodulation operation, the signal spectrum at the output signal of the Hall electromotive force signal detection circuit becomes such as shown in FIG. 7. Therefore, as will be understood from the signal spectrum of FIG. 7, the waveform of the output signal of the Hall electromotive force signal detection circuit which is seen in the time domain becomes the waveform of the Hall electromotive force signal Vsig(B) according to the magnetic field which is being detected plus, superposed, the ripple which is generated by modulating the offset voltage Vos(Hall) of the Hall element to the frequency f_chop of the chopper clock.

In order to realize a high precision Hall electromotive force signal, the occurrence of ripple at the output signal of this Hall electromotive force signal detection circuit must be canceled. Therefore, as one circuit system for cancelling this occurrence of the ripple, there is a circuit system which utilizes a feedback from the output signal of the Hall electromotive force signal detection circuit.

As explained above, for a Hall electromotive force signal detection circuit of the type which uses feedback to cancel the occurrence of the ripple in the output signal after signal amplification, for example, there is the one of Patent Document 1. As a circuit system which cancels the effect of an error signal (offset) in the output signal which takes binary values, for example, there is the one of Patent Document 2. In this Patent Document 2, a circuit configuration which uses an AD converter, digital circuit, and DA converter in a feedback circuit for cancelling the occurrence of the ripple is shown.

CITATIONS LIST

Patent Documents

Patent Document 1: U.S. Pat. No. 6,674,322 (B2)
Patent Document 2: U.S. Pat. No. 7,492,149 (B2)

Non-Patent Documents

Non-Patent Document 1: R S Popovic, Hall Effect Devices (ISBN-10:0750300965) Inst of Physics Pub Inc (1991 May)
Non-Patent Document 2: IEEE Journal of Solid-State Circuits, Vol. 32, No. 6, 1997, Pages 829 to 836, Bilotti et al., "Monolithic Magnetic Hall Sensor Using Dynamic Quadrature Offset Cancellation"

SUMMARY OF INVENTION

Problem to be Solved

What is described in the above-mentioned Patent Document 2 is a Hall electromotive force detection circuit which is used for a magnetic sensor which quantizes positional information of a magnetic body using a Hall element as binary information and outputs the positional information wherein a feedback circuit is provided for cancelling the offset of the Hall element and the offset of the signal amplification circuit. That is, this feedback circuit prevents detection error of the positional information of a magnetic body which is caused by the deviation of the transition point of the output signal which takes two values from the correct transition point as a result of the offset of the Hall element and the offset of the signal amplification circuit.

Although this Patent Document 2 shows an example of this feedback circuit configured using an AD converter, digital circuit, and DA converter, it does not refer at all to the art of utilization of a nonvolatile memory to realize an improvement in performance of shortening the initial pull-in time of this feedback circuit and the art of utilizing a nonvolatile memory to realize fault diagnosis of a magnetic sensor.

In this way, none of the above documents describe anything regarding fault diagnosis of a signal processing circuit. The present invention solves the problem of the need for fault diagnosis in a current sensor or other magnetic sensor which uses a Hall element.

The present invention was made in consideration of this situation, so has as its object the provision of a current sensor which has a self-diagnosis function and signal processing circuit which enables detection of faults in the state while the magnetic sensor is operating.

Solution to the Problem

The present invention was made to achieve the above object. The aspect of the invention which is described in claim 1 is a current sensor which is characterized by being provided with an offset component output circuit which extracts an offset component from an output signal of a Hall element which includes a signal component and an offset component, a reference signal output unit which outputs a reference signal, and an error signal generation circuit which generates an error signal based on the offset component which the offset component output circuit outputs and the reference signal.

Moreover, the aspect of invention as set forth in claim 2 is the aspect of invention as set forth in claim 1 characterized in that the offset component output circuit is provided with a signal amplification circuit which amplifies the output of the Hall element and outputs an output signal obtained by modulating one of the signal component and the offset component to a low frequency component including direct current and the other to a ripple component which is synchronized with a chopper clock and the offset component output circuit extracts the offset component from the output of the signal amplification circuit.

Moreover, the aspect of invention as set forth in claim 3 is the aspect of invention as set forth in claim 2 characterized in that it is further provided with a feedback circuit which receives the offset component and feeds back the offset component to the signal amplification circuit.

Moreover, the aspect of invention as set forth in claim 4 is the aspect of invention as set forth in claim 3 characterized in that the feedback circuit uses adaptive control which acts to cancel out the offset component which is contained in the output signal of the signal amplification circuit so as to control the offset component.

Moreover, the aspect of invention as set forth in claim 5 is the aspect of invention as set forth in claim 3 characterized in that it is provided with an operating value storage unit in which values for operating the feedback circuit are stored and in that the feedback circuit is provided with a selection circuit which sets one of the output of the offset component output circuit and the output of the operating value storage unit as the offset component.

Moreover, the aspect of invention as set forth in claim 6 is the aspect of invention as set forth in claim 5 characterized in that the selection circuit sets the output of the operating value storage unit as the offset component at the time of initial operation of the feedback circuit and sets the output of the offset component output circuit as the offset component after the initial operation.

Moreover, the aspect of invention as set forth in claim 7 is the aspect of invention as set forth in claim 5 characterized in that the circuit is provided with an operating value update unit which updates the value which is stored in the operating value storage unit based on the offset component which the offset component output circuit outputs.

Moreover, the aspect of invention as set forth in claim 8 is the aspect of invention as set forth in claim 2 characterized in that the signal amplification circuit outputs an output signal obtained by modulating the signal component to a low frequency component including direct current and the offset component to a ripple component which is synchronized with a chopper clock.

Moreover, the aspect of invention as set forth in claim 9 is the aspect of invention as set forth in claim 8 characterized in that the signal amplification circuit converts a signal, obtained by modulating the offset component to a low frequency component including direct current and the signal component to a ripple component which is synchronized with a chopper clock, to a current signal by a transconductance element, amplifies the signal, and modulates the obtained signal to the chopper clock frequency so as to output an output signal obtained by modulating the signal component to a low frequency component including direct current and the offset component to a ripple component which is synchronized with the chopper clock.

Moreover, the aspect of invention as set forth in claim 10 is the aspect of invention as set forth in claim 9 characterized in that the circuit is provided with a feedback circuit which receives the offset component and feeds back the offset component to the signal amplification circuit and in that the feedback circuit converts the offset component to a current signal by a transconductance element, amplifies the current signal, and feeds it back to the signal amplification circuit.

Moreover, the aspect of invention as set forth in claim 11 is the aspect of invention as set forth in claim 8 characterized in that the offset component output circuit extracts the offset component in the output of the signal amplification circuit by synchronous detection with the chopper clock frequency.

Moreover, the aspect of invention as set forth in claim 12 is the aspect of invention as set forth in claim 1 characterized in that the reference signal output unit is provided with a reference signal storage unit and outputs a reference signal based on a value which is stored in the reference signal storage unit.

Moreover, the aspect of invention as set forth in claim 13 is the aspect of invention as set forth in claim 12 characterized in that the value which is stored in the reference signal storage unit is a value which is obtained by measuring the offset component in advance.

Moreover, the aspect of invention as set forth in claim 14 is the aspect of invention as set forth in claim 12 characterized in that the reference signal storage unit is an OTPROM or EEPROM.

Moreover, the aspect of invention as set forth in claim 15 is the aspect of invention as set forth in claim 12 characterized in that the circuit is provided with a reference signal update unit which updates the value which is stored in the reference signal storage unit based on the offset component which the offset component output circuit outputs.

Moreover, the aspect of invention as set forth in claim 16 is the aspect of invention as set forth in any one of claim 1 characterized in that the error signal generation circuit generates an error signal based on results of the comparison between the offset component which the offset component output circuit outputs and the reference signal.

Moreover, the aspect of invention as set forth in claim 17 is the aspect of invention as set forth in claim 1 characterized in that the error signal generation circuit generates an error signal based on a ratio of or a difference between the value of the offset component which the offset component output circuit outputs and the value given by the reference signal.

Moreover, the aspect of invention as set forth in claim 18 is the aspect of invention as set forth in claim 1 characterized in that the error signal generation circuit performs the comparison between the value of the offset component which the offset component output circuit outputs and the value given by the reference signal using an upper limit value and lower limit value and generates an error signal based on the results of the comparison.

Moreover, the aspect of invention as set forth in claim 19 is a signal processing circuit which has a self-diagnosis function characterized by being provided with an offset component output circuit which extracts an offset component from a signal which includes a signal component and offset component, a reference signal output unit which outputs a reference signal, and an error signal generation circuit which generates an error signal based on the offset component which the offset component output circuit outputs and the reference signal.

Advantageous Effects of Invention

According to the present invention, an offset component of a sensor output signal which is extracted in the process of signal processing of the sensor output signal is utilized, so it is possible to perform self-diagnosis without using a special configuration.

Moreover, one of the signal component and the offset component is modulated to a low frequency component which includes direct current, while the other is modulated to a ripple component which is synchronized with a chopper clock, so it is possible to extract the offset component by a filter or other desired means.

Moreover, the offset component which the offset component output circuit extracts can be used for self-diagnosis and can be also used for adaptive control for cancelling out the offset component.

BRIEF DESCRIPTION OF THE DRAWINGS

FIGS. 2A to 2D are figures which show signal wave forms which are generated in the Hall element.

DESCRIPTION OF PREFERRED EMBODIMENTS

Below, embodiments of the present invention will be explained with reference to the drawings.

Example 1

Figure 4:
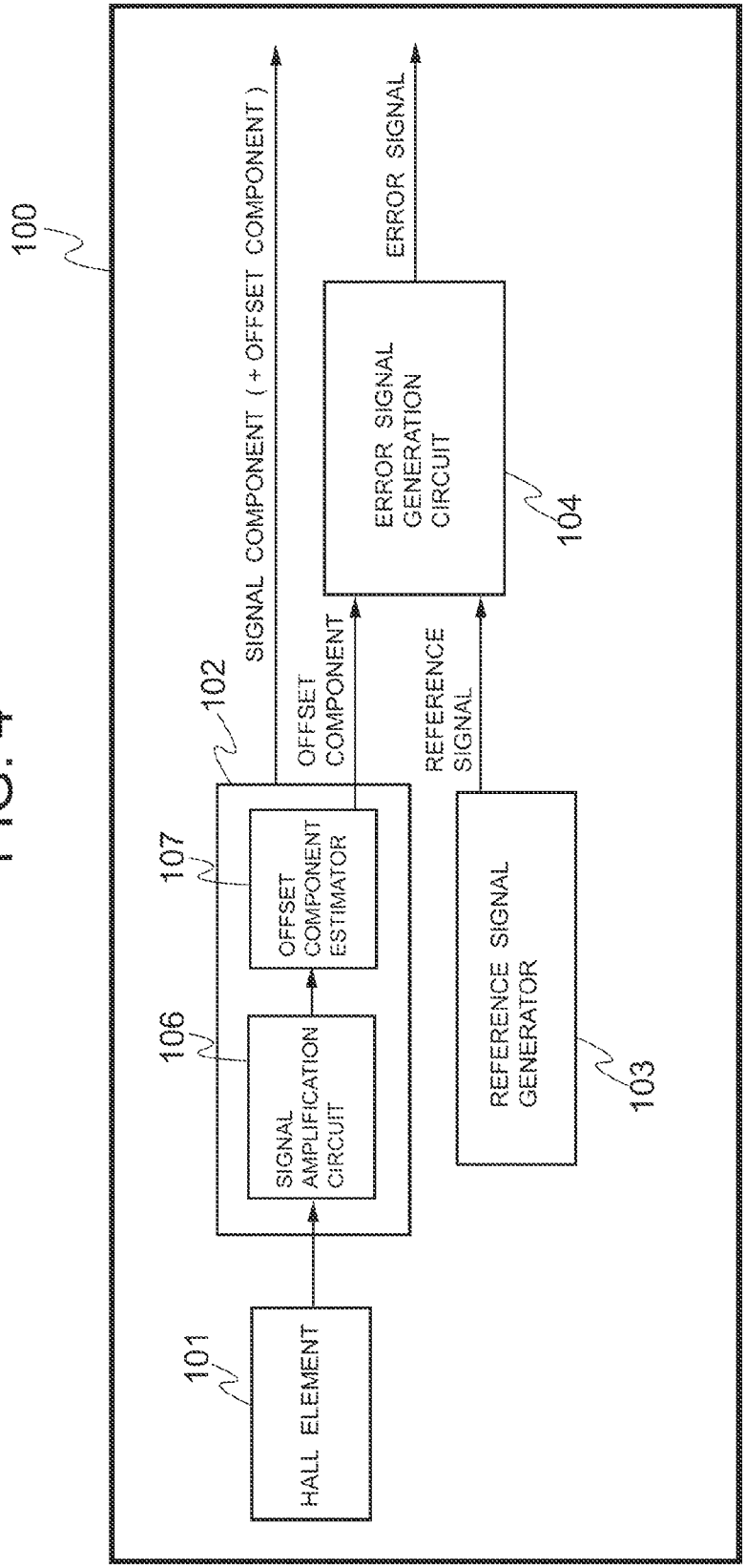
FIG. 4 is a figure of the block configuration for explaining Example 1 of a current sensor which has a self-diagnosis function according to the present invention.

FIG. 4 is a figure of the block configuration for explaining Example 1 of a current sensor which has a self-diagnosis function according to the present invention. In the figure, 100 indicates a current sensor, 101 indicates a Hall element, 102 indicates an offset component output circuit, 103 indicates a reference signal generator (serving also as an operating value storage unit; memory), 104 indicates an error signal generation circuit, 106 indicates a signal amplification circuit, and 107 indicates an offset component estimator.

The current sensor which has a self-diagnosis function of the present invention is provided with an offset component output circuit 102 which extracts an offset component from an output signal of a Hall element 101 which includes a signal component and an offset component, a reference signal generator 103 which outputs a reference signal, and an error signal generation circuit 104 which uses the offset component which the offset component output circuit 102 outputs and a reference signal as the basis to generate an error signal.

Due to this configuration, the offset component of a sensor output signal which is extracted in the process of signal processing of the sensor output signal is utilized, so self-diagnosis is made possible without using a special configuration.

Moreover, the offset component output circuit 102 is provided with a signal amplification circuit 106 which amplifies the output of the Hall element 101 and outputs an output signal obtained by modulating one of a signal component and offset component to a low frequency component which includes direct current and the other to a ripple component which is synchronized with a chopper clock and with an offset component estimator 107 and is configured to extract the offset component from the output of this signal amplification circuit 106.

Due to this configuration, since one of the signal component and the offset component is modulated to a low frequency component which includes direct current, while the other is modulated to a ripple component which is synchronized with a chopper clock, it is possible to extract the offset component by a filter or other desired means.

Moreover, the signal amplification circuit 106 outputs an output signal obtained by modulating the signal component to a low frequency component which includes direct current and the offset component to a ripple component which is synchronized with a chopper clock.

Due to this configuration, by modulating the signal component to a low frequency component which includes direct current and the offset component to a ripple component which is synchronized with a chopper clock, the signal component after the removing the offset component can be available without requiring additional operations such as modulation.

Moreover, the offset component output circuit 102 is configured so as to extract the offset component using synchronous detection with the chopper clock frequency in the output signal of the signal amplification circuit 106.

Due to this configuration, by using synchronous detection with the chopper clock frequency in the output signal of the signal amplification circuit 106, it is possible to extract the offset component.

Figure 6:
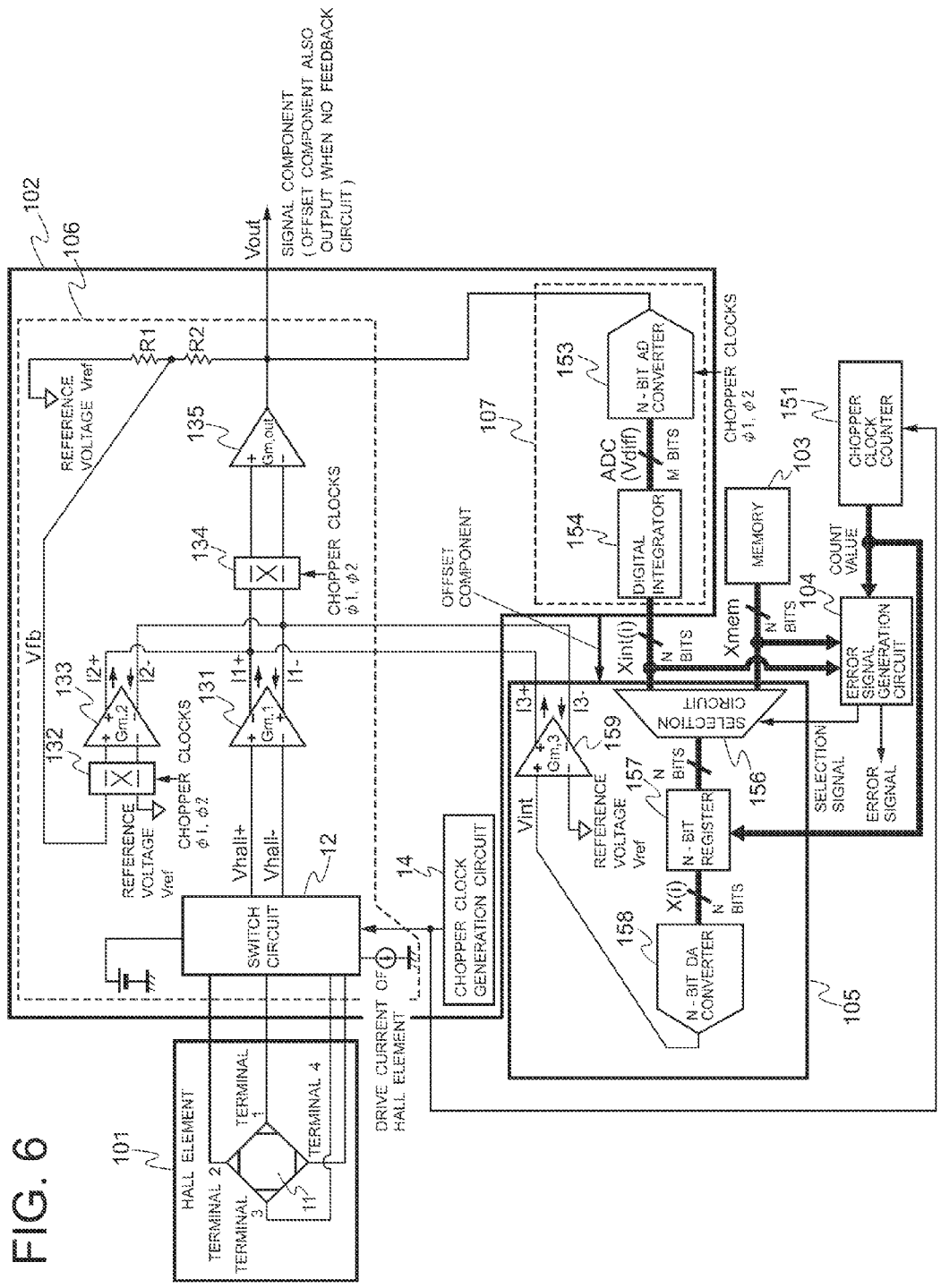
FIG. 6 is a figure of the circuit configuration for explaining Examples 1 and 2 of a current sensor which has a self-diagnosis function according to the present invention which are shown in FIG. 4 and FIG. 5.

FIG. 6 is a circuit diagram of the configuration for explaining an Example 1 of the current sensor which has a self-diagnosis function according to the present invention which is shown in FIG. 4. In the figure, 11 indicates a Hall element, 12 indicates a first switch circuit, 14 indicates a chopper clock generation circuit, 131 indicates a first transistor differential pair (Gm,1), 132 indicates a second switch circuit, 133 indicates a second transistor differential pair (Gm,2), 134 indicates a third switch circuit, 135 indicates a fourth transistor differential pair (Gm,out), 153 indicates an M-bit AD converter, and 154 indicates a digital integrator. Note that, the first switch circuit 12 is a switch circuit for realizing the spinning current method.

The signal amplification circuit 106 is provided with the first switch circuit 12, first transconductance element (transistor differential pair; Gm,1) 131, second switch circuit 132, second transconductance element (transistor differential pair; Gm,2) 133, third switch circuit 134, and output stage of the signal amplification circuit 106 (transistor differential pair; Gm,out) 135.

The signal processing circuit which has the fault diagnosis function according to the present invention is provided with a Hall electromotive force signal detection circuit which generates an output voltage signal which is obtained by amplifying a Hall electromotive force signal which is generated at the Hall element by a predetermined signal amplification gain. The first switch circuit 12 switches the positions of the terminal pair of the Hall element 11 between the position of the terminal pair for injecting drive current to the Hall element 11 and the position of the terminal pair for detecting the Hall electromotive force signal and modulates the Hall electromotive force signal which is generated at the Hall element 11 to the frequency of the chopper clock.

The signal processing circuit which has the self-diagnosis function (Hall electromotive force signal detection circuit) according to the present invention performs fault diagnosis in the state where the magnetic sensor is operating.

Moreover, the signal amplification circuit 106 converts the input signal which is composed of the signal component modulated to the chopper clock frequency and the DC offset component to a current signal by a transconductance element and amplifies the signal to obtain the output voltage signal.

This signal amplification circuit 106 outputs an output signal obtained by modulating the signal component to a low frequency component which includes direct current and the offset component to a ripple component which is synchronized with the chopper clock.

That is, the circuit is provided with a first transconductance element 131 which makes a conversion from the Hall electromotive force signal of the Hall element to current signal to generate a first current, resistors R1, R2 which divide the output voltage signal in voltage by predetermined ratio, a second switch circuit 132 which inverts the polarity of the voltage which is generated by voltage division in accordance with the chopper clock, a second transconductance element 133 which converts the output voltage of the second switch circuit 132 to current to generate a second current, a third switch circuit 134 which is placed after the first transconductance element 131 and performs a demodulation operation at the chopper clock frequency, and an output stage 135 which is connected to this third switch circuit 134.

Moreover, the signal amplification circuit 106 converts a signal obtained by modulating an offset component to a low frequency component which includes direct current and a signal component to a ripple component which is synchronized with a chopper clock to a current signal by a transconductance element, amplifies the current signal, and modulates this amplified signal with the chopper clock so as to output an output signal obtained by modulating a signal component to a low frequency component which includes direct current and an offset component to a ripple component which is synchronized with a chopper clock.

Due to this configuration, by using the transconductance elements for conversion to a current signal, it becomes possible to control the offset component which is contained in the output of the signal amplification circuit by adjusting the amount of current and becomes possible to use a simple circuit configuration to cancel out the offset component which is contained in the output signal of the signal amplification circuit.

Moreover, the offset component output circuit 102 is provided with the above-mentioned signal amplification circuit 106, chopper clock generation circuit 14, and offset component estimator 107.

The chopper clock generation circuit 14 generates a chopper clock which periodically drives the first switch circuit 12. Moreover, the signal amplification circuit 106 amplifies the output voltage signal from the first switch circuit 12. Moreover, the offset component estimator 107 is provided with an M-bit AD converter 153 and a digital integrator 154.

Example 2

Figure 5:
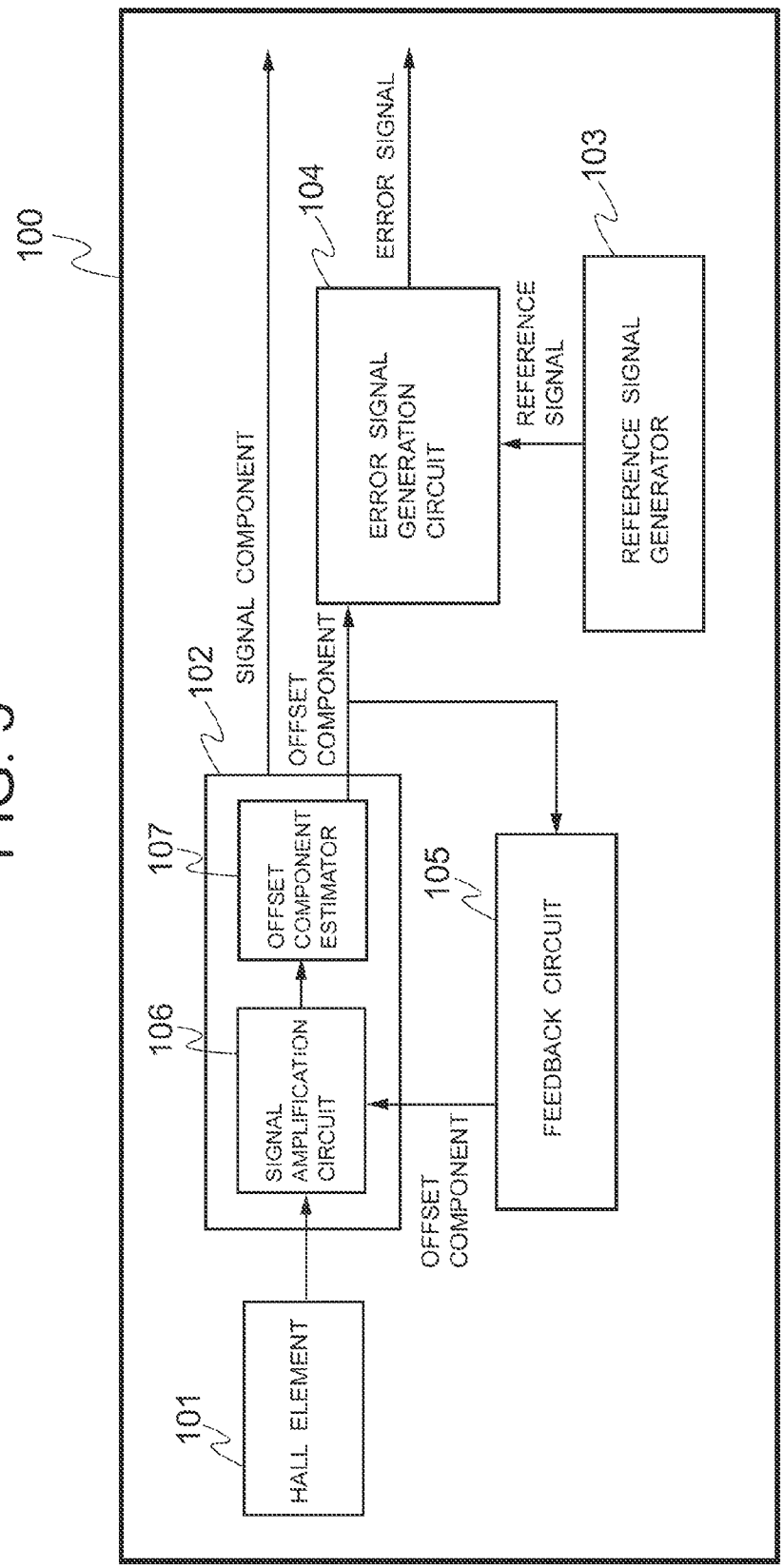
FIG. 5 is a figure of the block configuration for explaining Example 2 of a current sensor which has a self-diagnosis function according to the present invention.

FIG. 5 is a circuit block diagram of the configuration for explaining an Example 2 of the current sensor which has a self-diagnosis function according to the present invention, while FIG. 6 is a circuit diagram of the configuration for explaining Example 2 of the current sensor which has a self-diagnosis function according to the present invention which is shown in FIG. 5. In the figure, reference numeral 105 indicates a feedback circuit, 151 indicates a chopper clock counter, 156 indicates a selection circuit, 157 indicates an N-bit register, 158 indicates an N-bit DA converter, and 159 indicates a third transistor differential pair (Gm,3). Other than this, component elements which have the same functions as in FIG. 4 are assigned the same reference numerals.

The feedback circuit 105 receives the offset component and feeds back the offset component to the signal amplification circuit 106. It controls the offset component by adaptive control acting so as to cancel the offset component which is contained in the output signal of this signal amplification circuit 106.

Due to this configuration, the offset component which the offset component output circuit extracts can be used for self-diagnosis and can be applied to adaptive control for cancelling out the offset component.

Moreover, the feedback circuit 105 converts the offset component to a current signal by a transconductance element, amplifies the current signal, and feeds it back to the signal amplification circuit 106.

Due to this configuration, by using the transconductance element for conversion to a current signal, it becomes possible to control the offset component which is contained in the output of the signal amplification circuit by adjusting the amount of current and becomes possible to use a simple circuit configuration to cancel out the offset component which is contained in the output signal of the signal amplification circuit.

Moreover, the circuit is provided with an operating value storage unit 103 in which values for operating the feedback circuit 105 are stored. The feedback circuit 105 is provided with a selection circuit 156 which sets either the output of the offset component output circuit 102 or the output of the operating value storage unit 103 as the offset component.

Due to this configuration, it is possible to operate the feedback circuit based on a value which is stored in the operating value storage unit and thereby shorten the startup time right after the power-on.

Moreover, this selection circuit 156 sets the output of the operating value storage unit 103 as the offset component at the time of initial operation of the feedback circuit 105 and sets the output of the offset component output circuit 102 as the offset component after the initial operation.

Moreover, it is provided with an operating value updating unit (not shown) which updates the value which is stored in the operating value storage unit 103 based on the offset component which the offset component output circuit 102 outputs.

Moreover, the offset component estimator 107 extracts the offset component in the output of the signal amplification circuit 106 by synchronous detection with the chopper clock frequency.

Due to this configuration, by updating the value stored in the operating value storage unit with the value of the offset component which the offset component output circuit outputs, the value stored in the operating value storage unit can be updated with an value corresponding to the actual operating environment and the startup time after the power-on can be further shortened.

Moreover, the reference signal generator 103 is provided with a reference signal storage unit (not shown) and outputs a reference signal based on a value which is stored in this reference signal storage unit, so the value which is stored in the reference signal storage unit is the value which is obtained by measuring the offset component in advance. Moreover, the reference signal storage unit is preferably an OTPROM or EEPROM.

Due to this configuration, it becomes possible to perform self-diagnosis precisely by using a value obtained by measuring the offset component in advance as a value stored in the memory.

Moreover, the circuit is provided with a reference signal update unit (not shown) which updates the value which is stored in the reference signal storage unit based on the offset component which the offset component output circuit 102 outputs.

Due to this configuration, the offset component which the offset component output circuit 102 outputs is used as the basis to update the value which is stored in the memory 103, so it becomes possible to set the value of the reference signal to be the in-situ value corresponding to the actual operating environment.

Moreover, the error signal generation circuit 104 generates an error signal based on the result of the comparison of the offset component which the offset component output circuit 102 outputs and the reference signal. It generates the error signal based on the ratio of or difference between the value of the offset component which the offset component output circuit 102 outputs and the value given by the reference signal. Moreover, it compares the value of the offset component which the offset component output circuit 102 outputs and the value given by the reference signal using upper limit values and lower limit values and generates the error signal based on the results of the comparison. Due to this configuration, it is possible to perform self-diagnosis precisely.

Moreover, the feedback circuit 105 is provided with a selection circuit 156, N-bit register 157, N-bit DA converter 158, and third transconductance element (transistor differential pair; Gm,3) 159.

The feedback circuit 105 detects the signal component which is synchronized with the chopper clock from the output voltage signal of the signal amplification circuit 106 by synchronous detection, stores the DC signal which is obtained as a result of the synchronous detection as a servo variable in the N-bit register 157, and feeds back a current signal in the signal amplification circuit 106.

Moreover, the memory 103 stores a value obtained by measuring in advance a value after the convergence of the servo variable of adaptive control which is stored in the N-bit register 157 when the feedback circuit 105 performs adaptive control for cancelling out ripple-shaped noise in the output voltage signal of the signal amplification circuit 106.

Moreover, the error signal generation circuit 104 compares the value which is stored in the memory 103 and the value which is determined by adaptive control of the feedback circuit 105 to generate an error signal. Specifically, this error signal generation circuit 104 generates an error signal based on the results of the comparison operation between the value stored in the memory 103 and the value of the servo variable which is determined by adaptive control of the feedback circuit 105.

The operation of comparing these two values is performed in the error signal generation circuit 104 by calculating the difference between the two values or the ratio of the two values. The error signal generation circuit 104 has the function of comparing the value of the difference or the ratio with an upper limit value and lower limit value and using the results as the basis to issue an error signal.

Moreover, the selection circuit 156 selects the value which is stored in the N-bit register from the value which is stored in the memory 103 and the value of the servo variable which is determined by adaptive control of the feedback circuit 105.

Moreover, the memory 103 is an OTP (one time programmable) ROM or EEPROM (electrically erasable programmable read-only memory). Moreover, the magnetic sensor is most suitably a Hall element.

The above was a general explanation using FIG. 6 of a current sensor which has a fault diagnosis function according to the present invention in relation to a Hall element performing the spinning current method, but this current sensor can be utilized as a signal processing circuit. Below, the operation of a signal processing circuit will be explained in detail based on FIG. 6.

The signal processing circuit which has the self-diagnosis function of the present invention is provided with an offset component output circuit 102 which extracts an offset component from a signal which includes a signal component and an offset component, a reference signal generator 103 which outputs a reference signal, and an error signal generation circuit 104 which generates an error signal based on the offset component which the offset component output circuit 102 outputs and a reference signal.

Due to this configuration, since the offset component of a sensor output signal which is extracted in the process of signal processing of a sensor output signal is used, it is possible to perform self-diagnosis without using any specific configuration.

The Hall electromotive force signal which is generated at the Hall element is modulated at the first switch circuit 12 to the chopper clock frequency f_chop and is input as the signal Vhall to the transistor differential pair (Gm,1) 131. At the transistor differential pair (Gm,1) 131, the current I1 is generated in accordance with the Formula 2. Here, the transistor differential pair (Gm,1) 131 of the signal amplification circuit also has an offset Vos(Gm,1), so the current I1 is affected by this offset voltage Vos(Gm,1).

Output current $I1$ from differential pair $Gm, 1$ of transistors  Formula 2

$$\begin{cases} I1(\phi1) = Gm, 1 \cdot (Vhall(\phi1) + Vos(Gm, 1)) = & \text{(when chopper} \\ Gm, 1 \cdot (+Vsig(B) + Vos(\text{Hall}) + Vos(Gm, 1)) & \text{clock} = \varphi1) \\ I1(\phi2) = Gm, 1 \cdot (Vhall(\phi2) + Vos(Gm, 1)) = & \text{(when chopper} \\ Gm, 1 \cdot (-Vsig(B) + Vos(\text{Hall}) + Vos(Gm, 1)) & \text{clock} = \varphi2) \end{cases}$$

Note that, in FIG. 6, the current I1 is a differential signal. For this reason, if explaining the notations I1+, I1− in FIG. 6, it must be noted that there is the relationship of I1=(I1+)−(I1−).

In the signal processing circuit which has the fault diagnosis function which is shown in FIG. 6, feedback using the resistors R1, R2 from the output voltage Vout is prepared. Here, if making the reference voltage Vref to be 0, as shown in Formula 3, a feedback voltage Vfb from the output voltage Vout is produced.

Feedback from output voltage  Formula 3
Vout of signal amplification circuit $$Vfb = \frac{R1}{R1 + R2} Vout$$

The transistor differential pair (Gm,2)133 in the signal amplification circuit is driven by the feedback voltage Vfb from the output voltage Vout expressed by the Formula 3, but the transistor differential pair (Gm,2)133 also has an offset Vos(Gm,1), so the current I2 which is output from Gm,2 is expressed by Formula 4.

Output current $I2$ from differential pair $Gm, 2$ of transistors  Formula 4

$$\begin{cases} I2(\phi1) = +Gm, 2 \cdot Vfb + Gm, 2 \cdot Vos(Gm, 2) & \text{(when chopper clock} = \phi1) \\ I2(\phi2) = -Gm, 2 \cdot Vfb + Gm, 2 \cdot Vos(Gm, 2) & \text{(when chopper clock} = \phi2) \end{cases}$$

Note that, in FIG. 6, the current I2 is a differential signal. For this reason, if explaining the notations I2+,I2− in FIG. 6, it must be noted that there is the relationship of I2=(I2+)−(I2−).

In the signal processing circuit which has the fault diagnosis function which is shown in FIG. 6, the sum of the output current I1 from the transistor differential pair (Gm,1) 131 and the output current I2 from the transistor differential pair (Gm, 2) 133 is made zero by feedback. Therefore, if assuming I1+I2=0 and calculating the output voltage Vout of the signal processing circuit which has the fault diagnosis function which is shown in FIG. 6, the Formula 5 is obtained.

Output voltage $Vout$ of signal processing circuit provided with self-diagnosis function     Formula 5

$$\begin{cases} Vout(\phi 1) = \left(1 + \frac{R2}{R1}\right)\left(\frac{Gm,1}{Gm,2}\right) Vsig(B) - & \text{(when chopper} \\ \left\{\frac{Gm,1 \cdot Vos(Hall) + Gm,1 \cdot}{Vos(Gm,1) + Gm,2 \cdot Vos(Gm,2)}\right\} & \text{clock} = \phi 1) \\ Vout(\phi 2) = \left(1 + \frac{R2}{R1}\right)\left(\frac{Gm,1}{Gm,2}\right) Vsig(B) + & \text{(when chopper} \\ \left\{\frac{Gm,1 \cdot Vos(Hall) + Gm,1 \cdot}{Vos(Gm,1) + Gm,2 \cdot Vos(Gm,2)}\right\} & \text{clock} = \phi 2) \end{cases}$$

Here, as shown in Formula 5, it must be noted that the signal Vsig(B) which is modulated by the chopper clock is demodulated by the third switch circuit 134 which is shown in FIG. 6. In this way, the signal Vsig(B) which is being detected is modulated by the chopper clock at a prior stage, then demodulated by the chopper clock at a later stage, so the circuit similar to the signal amplification circuit which is shown in FIG. 6 is a circuit configuration called a "chopper amp". A chopper amp is a circuit configuration known as a signal amplification circuit for realizing an offset cancellation function.

Figure 7:
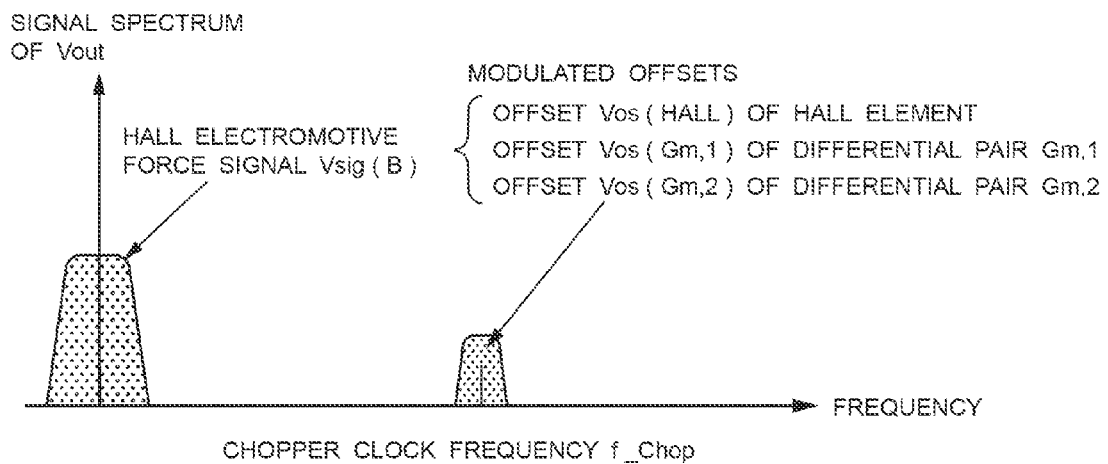
FIG. 7 is a figure which shows a signal spectrum of an output voltage Vout of the signal amplification circuit which is shown in FIG. 6.

As will be understood from the fact that in the above-mentioned Formula 5, the parenthesized components invert in polarity each time the phase of the chopper clock switches between $\phi 1$ and $\phi 2$, in the signal processing circuit which has the fault diagnosis function which is shown in FIG. 6, each time the phase of the chopper clock switches between $\phi 1$ and $\phi 2$, the sum of the offset voltage of the Hall element, the offset voltage of Gm,1, and the offset voltage of Gm,2 is modulated by the chopper clock whereby ripple-shaped noise is generated at the output Vout of the signal amplification circuit. Seeing Formula 5, it can be understood that the signal spectrum of the output voltage Vout of the signal amplification circuit becomes a spectrum such as shown in FIG. 7. In FIG. 7, which shows the signal spectrum of Vout in the frequency domain, the component at the chopper clock frequency f_chop, if viewed in the time domain, becomes ripple-shaped noise which is superposed on the output Vout of the signal amplification circuit. Therefore, the reduction of the ripple-shaped noise which is superposed on the output Vout of the signal amplification circuit is nothing other than the reduction of the component at the chopper clock frequency f_chop in the signal spectrum which is shown in FIG. 7.

Moreover, if removing the presence of the above-mentioned ripple-shaped noise from Formula 5, Formula 6 is obtained. This shows that in the signal processing circuit which has the fault diagnosis function which is shown in FIG. 6, the Hall electromotive force signal Vsig(B) which corresponds to the magnetic field B being detected of the magnetic sensor is amplified by a predetermined signal amplification gain (1+R2/R1)(Gm,1/Gm,2).

Formula of signal amplification of Hall electromotive     Formula 6
force signal after removal of ripple-like noise $$Vout = \left(1 + \frac{R2}{R1}\right)\left(\frac{Gm,1}{Gm,2}\right) Vsig(B)$$

In this way, in the signal processing circuit which has the fault diagnosis function which is shown in FIG. 6, it is required that the ripple-shaped noise which is superposed on the output Vout of the signal amplification circuit be sufficiently reduced.

Therefore, for the purpose of suppressing the occurrence of ripple-shaped noise, in the signal processing circuit which has the fault diagnosis function which is shown in FIG. 6, in the signal amplification circuit which amplifies the Hall electromotive force signal, a feedback circuit 105 is prepared which is connected to the output signal Vout of the signal amplification circuit and to the circuit node in which the current I1 and the current I2 are added together.

This feedback circuit 105 is comprised of an N-bit register 157, N-bit DA converter 158, and transistor differential pair (Gm,3) 159.

The transistor differential pair (Gm,3) 159 is driven by the output voltage Vint from the N-bit DA converter 158. The current I3 which is output from the transistor differential pair (Gm,3) 159 acts so as to cancel the DC offset current component Ios which is contained in the current I1+I2=Gm, 1·Vhall+Gm,2·Vfb which is expressed by Formula 7. That is, due to the action of the current I3 which is output from the transistor differential pair (Gm,3) 159 in satisfying Formula 8, the occurrence of ripple-shaped noise at the output voltage signal Vout of the signal amplification circuit can be eliminated.

Formula 7: DC offset current Ios causing ripple-shaped noise $$Ios = Gm,1 \cdot Vos(\text{Hall}) + Gm,1 \cdot Vos(Gm,1) + Gm,2 \cdot Vos(Gm,2)$$

Formula 8: Cancellation of DC offset current Ios by current I3

$$Ios + I3 = 0$$

Note that, the current I3 which is shown in FIG. 6 is a differential signal. Therefore, if explaining the notations I3+, I3− in FIG. 6, it must be noted that there is the relationship of I3=(I3+)−(I3−).

Below, the feedback circuit 105 in the signal processing circuit which has the fault diagnosis function which is shown in FIG. 6 will be explained in detail.

The chopper clock counter 151 is a circuit which counts the chopper clock taking the two phase values ($\phi 1$, $\phi 2$) so as to generate a counter value "i".

Figure 8:
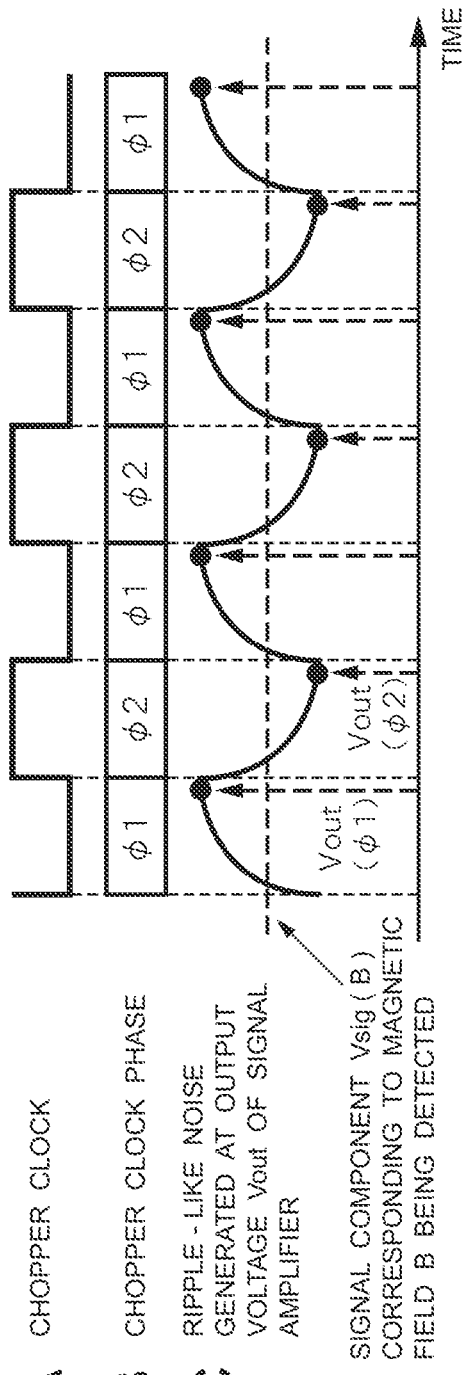
FIGS. 8A to 8C are figures which explain the way in which Vout($\phi$1) and Vout($\phi$2) are sampled and detected by the magnetic sensor using Hall element when there is no temporal variation in the magnetic field to be detected or the temporal variation is slow.

In the signal processing circuit which has the fault diagnosis function which is shown in FIG. 6, an M-bit AD converter 153 is connected to the output voltage signal Vout of the signal processing circuit which has the fault diagnosis function. This performs AD conversion of the difference signal Vdiff=Vout ($\phi 1$)−Vout($\phi 2$) between the signal Vout($\phi 1$) which is obtained by sampling Vout at the timing just before the phase of the chopper clock switches from $\phi 1$ to $\phi 2$ and the signal Vout($\phi 2$) which is obtained by sampling Vout at the timing just before the phase of the chopper clock switches from $\phi 2$ to $\phi 1$ so as to generate an M-bit width digital signal ADC(Vdiff). Here, FIGS. 8A to 8C are figures for explaining the sampling operations of the signal Vout by the M-bit AD converter.

The digital integrator 154 is a circuit which performs an integration operation expressed by the difference equation of Formula 9 on the output signal ADC(Vdiff) of the M-bit AD converter 153 using a counter value "i" of the chopper clock counter 151. Here, α is a constant which determines the time constant of the integrator (filter characteristic). In the signal processing circuit of the present invention, the frequency characteristic of the feedback loop has to be made narrow, so in general, a small positive value of 0.001 or less is used.

Formula 9: Difference equation expressing integration operation of digital integrator $$X(i)=(1-\alpha)X(i-1)+\alpha ADC(V\text{diff})$$

From the difference equation of Formula 9, the transfer function Hint(z) of the digital integrator becomes a 1st order low pass filter which is given by Formula 10. Therefore, the register value X(i) of the N-bit register which is placed after the digital integrator is a value which is obtained by an integration operation on the output signal ADC(Vdiff) of the M-bit AD converter.

Transfer function expressing integration operation of digital integrator  Formula 10

$$Hint(z) = \frac{\alpha}{1-(1-\alpha)z^{-1}}$$

When the counter value of the chopper clock counter 151 is "i", the digital signal X(i) which is stored in the N-bit register 157 is converted by the N-bit DA converter 158 to an analog voltage signal Vint. Formula 11 is a formula which expresses the DA conversion operation in the N-bit DA converter 158.

Formula 11: Generation of analog voltage signal Vint by DA conversion $$Vint=DAC(X(i))$$

The analog voltage signal Vint which is output from the N-bit DA converter 158 is converted to the current I3 by the transistor differential pair (Gm,3) 159. Formula 12 is a formula which expresses the generation of the current I3 at the transistor differential pair (Gm,3) 159.

Formula 12: Generation of current I3

$$I3=Gm,3\cdot Vint=Gm,3\cdot DAC(X(i))$$

Figure 9:
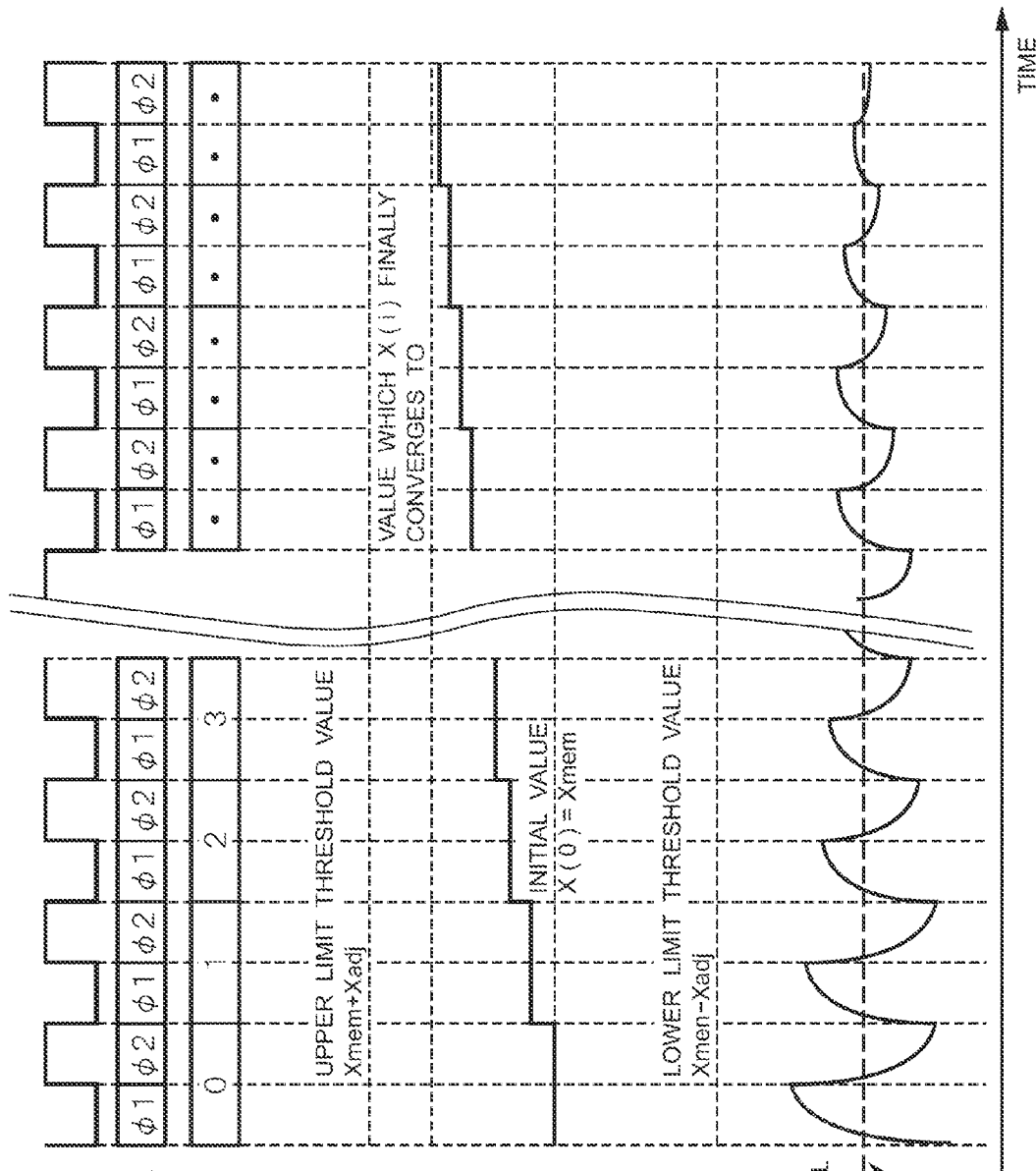
FIGS. 9A to 9D are figures which explain the way in which a ripple-shaped noise is cancelled by adaptive control of a servo variable X(i) and also the way in which the servo variable X(i) converges when a fault related with offset is not detected.
Figure 10:
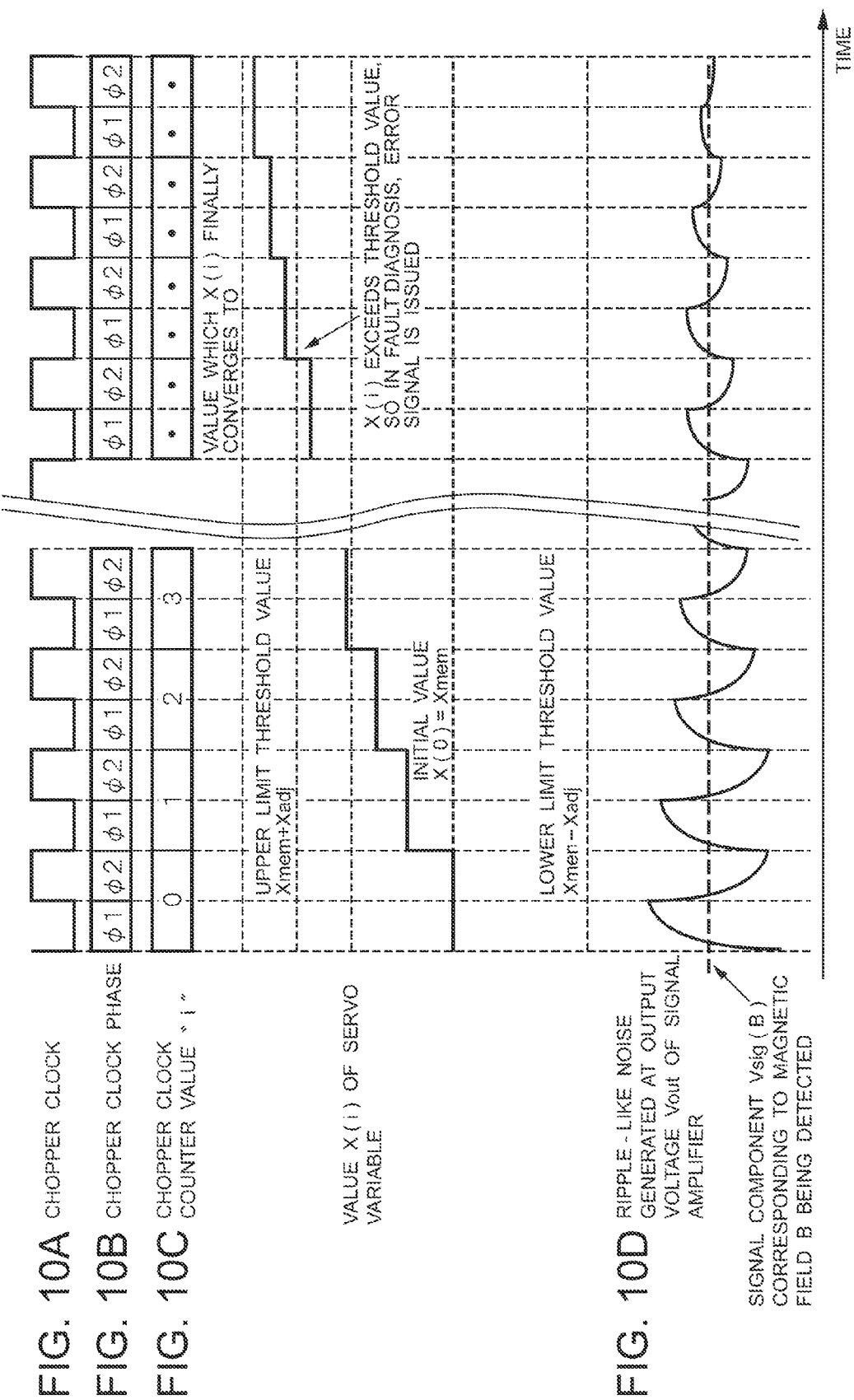
FIGS. 10A to 10D are figures which explain the way in which a ripple-shaped noise is cancelled by adaptive control of a servo variable X(i) and also the way in which the servo variable X(i) converges when a fault related with offset is detected.

As will be understood from the above explanation, the feedback circuit in FIG. 6 of the signal processing circuit which has the fault diagnosis function according to the present invention performs adaptive control (servo operation) so as to reduce the occurrence of ripple-shaped noise in the Hall electromotive force signal Vout after signal amplification when the offset voltage of the Hall element, the offset voltage of the transistor differential pair (Gm,1) 131, and the offset voltage of the transistor differential pair (Gm,2) 133 are given. That is, as time elapses, each time the value "i" of the chopper clock counter increases, the servo variable X(i) which is stored in the N-bit register 157 is adaptively controlled (servo operation), so the servo variable X(i) converges toward the value satisfying Formula 8. FIG. 9 and FIG. 10 are figures for explaining the way in which such adaptive control (servo control) of the servo variable X(i) works.

Figure 3:
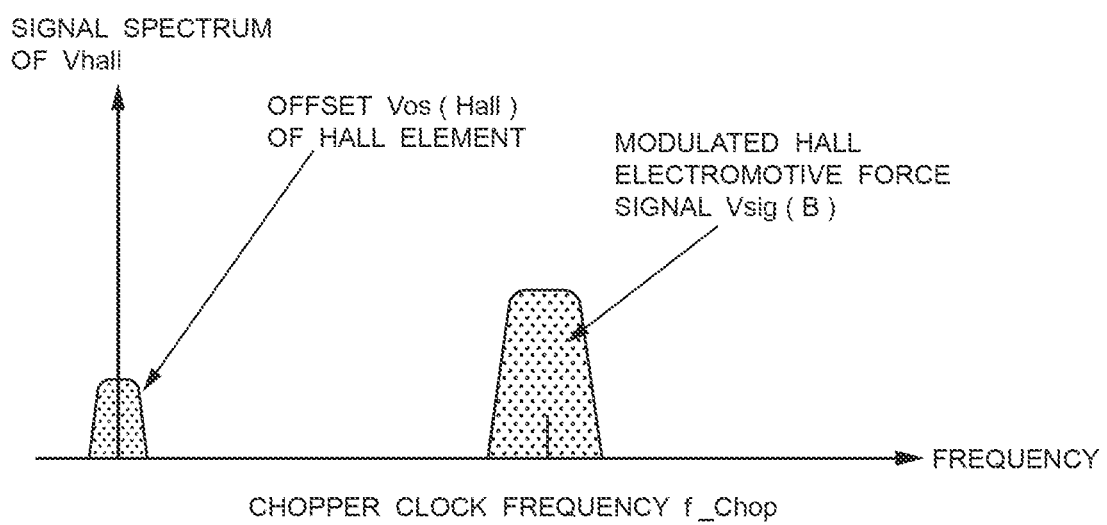
FIG. 3 is a figure which shows a signal spectrum of a signal Vhall which is generated at the Hall element.

Here, the operation of the feedback circuit in FIG. 6 of the signal processing circuit which has the fault diagnosis function according to the present invention will be explained. The offset voltage of the Hall element, the offset voltage of the transistor differential pair (Gm,1) 131, and the offset voltage of the transistor differential pair (Gm,2) 133 are converted into the DC offset current Ios which is expressed by Formula 7. This DC offset current Ios is modulated at the third switch circuit 134 to the frequency of the chopper clock whereby ripple-shaped noise (viewed in the signal spectrum, FIG. 3) is generated at the output voltage signal Vout of the signal amplification circuit.

Therefore, by using the above-mentioned feedback current I3 to provide feedback so that sum of the DC component which is contained in (I1+I2), that is, Ios, and I3 becomes zero (Formula 8), it is possible to eliminate the occurrence of the above-mentioned ripple-shaped noise. As will be understood from this, in FIGS. 8A to 8C, all of the above-mentioned offsets, that is, the offset voltage of the Hall element, the offset voltage of the transistor differential pair (Gm,1) 131, and the offset voltage of the transistor differential pair (Gm,2) 133, are cancelled.

Below, the feedback circuit in the signal processing circuit of the present invention and the operation of that feedback circuit will be explained in detail.

The circuit blocks which are contained in the feedback circuit which is shown in FIG. 6 function as explained below so as to realize adaptive control (servo control) cancelling out the generation of ripple-shaped noise which is generated at the output signal of the signal amplifier.

The M-bit AD converter 153 performs an AD conversion converting the ripple-shaped noise component Vdiff=Vout(φ1)−Vout(φ2) which is included in the amplified Hall electromotive force signal Vout to generate an M-bit digital signal ADC(Vdiff).

The digital integrator 154 performs an integration operation on the M-bit digital signal ADC (Vdiff) each time the chopper clock counter 151 performs a count operation and the counter value "i" is counted up and updates the output signal Xint(i) of the N-bit digital integrator 154.

The value which is selected by the selection circuit 156 from either of the value Xmem which is stored in the memory 103 or the output signal Xint(i) of the digital integrator 154 is stored in the N-bit register 157 as the value X(i).

The N-bit DA converter 158 converts the value X(i) of the N-bit servo variable to an analog voltage signal Vint.

The transistor differential pair (Gm,3) 159 generates a current I3 in accordance with the voltage value of Vint and cancels the DC component in the current I1+I2 which is generated due to the offset of the Hall element and the offset of the signal amplification circuit.

In this way, the feedback circuit 105 selects the value to be fed back to the signal amplification circuit 106 from the value Xmem which is stored in the memory or the value which is determined by adaptive control (servo operation) of the feedback circuit 105 (this is output Xint(i) of the digital integrator) for a feedback operation.

The characterizing features of the signal processing circuit which has the fault diagnosis function according to the present invention shown in FIG. 6 are as follows:

1) A selection circuit is provided for selecting one of the value from Xmem which is stored in the memory and the output signal Xinit(i) of the digital integrator as the servo variable X(i) of the feedback circuit for cancelling out ripple in the output of the signal amplification circuit.

2) The selection operation of the above-mentioned selection circuit is controlled by a selection signal which is generated by an error signal generation circuit. In the startup operation just after the power is turned on, the operation of the feedback circuit is started using Xmem as the initial value of the servo variable. That is, when in the startup operation just after the power is turned on, the counter value "i" of the chopper clock counter is set i=0 as the initial value of the servo variable, then the value of Xem which is read out from the memory is used to set X(0)=Xmem. After the initial startup operation, that is, when i≥1, X(i)=Xint(i) is set and adaptive control (servo operation) of the feedback circuit is performed. The selection operation of this selection circuit is controlled by the selection signal which is generated by the error signal generation circuit.

3) When the discrepancy between the value of the servo variable X(i) after the convergence and the value Xmem which is stored in the memory is over a predetermined allowable range Xadj, as shown in Formula 13, it is judged that in the magnetic sensor using a Hall element, there is an abnormality in the offset of the Hall element or an abnormality in the offset of the signal amplification circuit and an error signal is issued from the magnetic sensor.

Judgment of self-diagnosis of fault in signal processing circuit having fault diagnosis function of present invention  Formula 13

$$\begin{cases} |X(i) - Xmem| \leq Xadj \Rightarrow i_{Judge\ no\ fault} \\ |X(i) - Xmem| > Xadj \Rightarrow i_{Judge\ fault} \end{cases}$$

For the magnetic sensor which is provided with the signal processing circuit which has the fault diagnosis function according to the present invention, when shipping out the product, calibration is performed to determine the servo variable Xmem which is stored in the memory. This method of calibration, as explained below, becomes an extremely simple method. For example, the magnetic sensor which is provided with the signal processing circuit which is provided with the fault diagnosis function according to the present invention is operated for a sufficiently long time under certain environmental condition with a predetermined ambient temperature and stress on the magnetic sensor.

FIGS. 9A to 9D are figures which explain the way in which a ripple-shaped noise is cancelled by adaptive control of a servo variable X(i) and also the way in which the servo variable X(i) converges when a fault related with offset is not detected. FIGS. 10A to 10D are figures which explain the way in which the ripple-shaped noise is cancelled by adaptive control of a servo variable X(i) and also the way in which the servo variable X(i) converges when a fault related with offset is detected.

As shown in FIGS. 9A to 9D and FIGS. 10A to 10D, as time elapses, the value of the servo variable X(i) converges and the ripple-shaped noise at the output signal of the signal amplification circuit converges toward zero. Therefore, after the elapse of sufficiently long time, it is sufficient to memorize the value of the servo variable X(i) as the value of Xmem in the memory (Formula 14). Here, in FIG. 6, while not explicitly shown, in the signal processing circuit which has the fault diagnosis function according to the present invention, a memory write function is provided for writing the value X(i) which was determined in the signal processing circuit which has the fault diagnosis function according to the present invention according to the above-mentioned calibration method as the value of Xmem in the memory.

Formula 14: Setting of value of Xmem in calibration at time of product shipment $$Xmem \Leftarrow X(i)$$

(where, "i" is sufficiently large value)

Moreover, at this time, the value of Xmem which is stored in the memory becomes a value of X(i) corresponding to the environmental conditions when performing calibration (ambient temperature and stress on the magnetic sensor), so the variation in offsets (offset of Hall element and offset of signal amplification circuit) which occurs due to the variation in the environmental condition such as ambient temperature and stress on the magnetic sensor between the time when the calibration explained above is performed and the time when the magnetic sensor is operating in actual use after it is shipped is cancelled by adaptive control (servo operation) of the servo variable X(i) in the feedback circuit.

As explained above, in the magnetic sensor which is provided with the signal processing circuit which has the fault diagnosis function according to the present invention, the value of Xmem which is stored in the memory is determined in the calibration operation at the time of product shipment. The value of Xem which is obtained by a calibration operation explained above becomes a value which corresponds to the offset value of the Hall element and the offset value of the signal amplification circuit, which differ for each sample of the magnetic sensor. However, after product shipment, if the ambient temperature during the magnetic sensor operation is different from the ambient temperature when the calibration is performed at the time of shipment, the value of the offset explained above also deviates from the value at the time of calibration due to the difference in ambient temperatures. Moreover, when the magnetic sensor is mounted after the product shipment of the magnetic sensor, the stress on the magnetic sensor (package stress) varies from the stress at the time when the calibration was performed, then the value of the offset explained above varies from the value at the time of calibration.

As explained above, in a magnetic sensor which is provided with the signal processing circuit which has the fault diagnosis function according to the present invention, the deviation in the offset (variation in offset of Hall element and variation in offset of signal amplification circuit), which is caused by the variation in the environmental condition between the time at which the magnetic sensor is in the actual use after the product shipment and the time at which the calibration of the magnetic sensor is performed, is compensated for by the adactive control of the feedback circuit (servo operation).

Next, the variation in the offset of a Hall element due to temperature variation will be explained below.

Figure 1A:
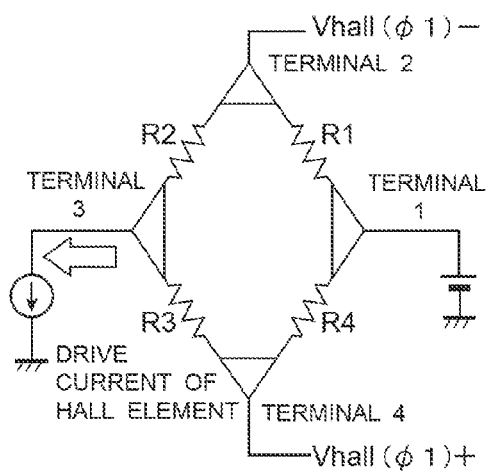
FIGS. 1A and 1B are figures which explain the detection of a Hall electromotive force when changing a direction of a drive current which biases the Hall element between 0 degrees and 90 degrees each time a phase of a chopper clock switches between the two values of $\phi 1$ and $\phi 2$.
Figure 1B:
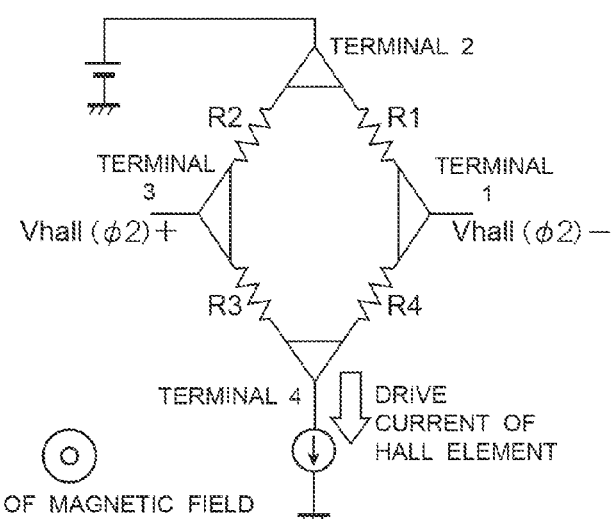

In a CMOS semiconductor chip, when a Hall element is formed as an N-well, the resistance value of the N-well generally increases along with the temperature. Therefore, in a CMOS semiconductor chip, the offset of the Hall element which is formed as an N-well, as can be expected from the model of the Hall element using resistance bridges shown in FIG. 1, generally increases with rising temperature.

Therefore, in a CMOS semiconductor chip, the range of the temperature variation of the offset value of a Hall element which is formed as an N-well is normally about 0.5 to 2 times the offset value at room temperature in the temperature range from the low temperature region below the freezing temperature and a high temperature region of 100° C. or more. If the temperature variation of the offset is observed to exceed this range significantly, fault related with the Hall element is inferred. Considering the temperature variation of the offset of the Hall element, the value of Xadj is set to be about 50%.

Because the actual variation of the offset of the Hall element is caused by the stress as well as the temperature, the value of Xadj is determined by taking the cause of the offset variation such as temperature and stress into consideration.

Next, the fault-diagnosis carried out in the adaptive control (servo operation), which is an most outstanding feature of the present invention, will be explained below.

Concerning the magnetic sensor which is provided with the signal processing circuit which has the fault diagnosis function according to the present invention, the magnetic sensor supports a function in which the adaptive control (servo operation) of the feedback circuit compensates for the variation of the offset in real time, which is caused by the variation in the environmental condition between the time when the calibration is carried out at the time of product shipment and the time when the magnetic sensor is operating in actual use after it is shipped. This function supported by the magnetic sensor can be utilized for the self-diagnosis of fault of the magnetic sensor.

That is, the self-diagnosis result is determined according to whether the value after convergence of the servo variable $X(i)$ in the feedback circuit is included in the range of $Xmem \pm Xadj$ or is outside this range (Formula 13).

FIGS. 9A to 9D are figures which explain the operation of the servo variable $X(i)$ when the value of $X(i)$ after the convergence is included in the range of $Xmem \pm Xadj$. In this case, an error signal is not issued. FIGS. 10A to 10D are figures which explain the operation of the servo variable $X(i)$ in the case where the value of $X(i)$ after the convergence is not included in the range of $Xmem \pm Xadj$. In this case, an error signal is issued.

That is, in the magnetic sensor which is provided with the signal processing circuit which has the fault diagnosis function according to the present invention, the calibration value which is stored in the memory is used right after the power-on, so it is possible to shorten the startup time after the power-on. Moreover, a register value which is updated during the operation of the magnetic sensor is compared with the calibration value which is stored in the memory, so it is possible to perform self-diagnosis of fault in the Hall element and Hall electromotive force signal detection circuit during the operation as a magnetic sensor.

During the product lifetime after the magnetic sensor is shipped out as a product, a fault related to the Hall element may occur. Concerning faults in the magnetic sensor, the type of fault in which an abnormality occurs in the offset of the Hall element can be detected by means of the self-diagnosis function by the magnetic sensor which is provided with a signal processing circuit which has the fault diagnosis function according to the present invention.

Moreover, as is understood from figure FIG. 6, in the signal processing circuit which has the fault diagnosis function according to the present invention, the circuit which is added for realizing the self-diagnosis function of a fault is only a simple digital circuit for performing a comparison operation for monitoring the difference between the value of the servo variable $X(i)$ and the value of Xem which is stored in the memory, so the signal processing circuit of the present invention is a circuit configuration which realizes self-diagnosis of a fault at an extremely low cost and is advantageous for the realization of a magnetic sensor which has a high reliability.

Among magnetic sensors, as for the current sensor which detects the inverter current of a motor by contactless means, the motor control is carried out based on the value of the inverter current which is detected by the current sensor. Therefore, the signal processing circuit provided with the fault diagnosis function according to the present invention enabling self-diagnosis of a fault during the operation of the magnetic sensor means that it is possible to inexpensively produce a current sensor provided with a high reliability.

Here, the signal processing circuit which has the fault diagnosis function which is shown in FIG. 6 modulates the Hall electromotive force signal which is generated at the Hall element to the chopper clock frequency f_chop at the first switch circuit 12, converts the obtained signal Vhall by the transistor differential pair (Gm,1) 131 to the current I1, then demodulates it at the third switch circuit 134 by the chopper clock to generate the amplified Hall electromotive force signal Vout. The signal amplification gain is given by the Formula 6. In the signal processing circuit which has the fault diagnosis function which is shown in FIG. 6, the signal amplification gain is determined by the feedback current I2 from the transistor differential pair (Gm,2) 133, so this circuit is the type of signal amplifier circuit configurations generally called a "current feedback type chopper amp". But in regard to the object of cancelling out the occurrence of ripple-shaped noise in the Hall electromotive force signal Vout after signal amplification, as far as the cancellation of the occurrence of the ripple-shaped noise in the Hall electromotive force signal, which is the object of this invention, is concerned, the configuration of the signal amplification circuit is not limited to the current feedback type. Therefore, the present invention is not limited to the configuration of the current feedback chopper type chopper amp.

As explained so far, a self-diagnosis function of fault can be realized by the signal processing circuit of the present invention which implements the means for monitoring the variation of the value of the servo variable in the initial pull-in process of adaptive control and means for comparing the value of the servo variable after the convergence of the adaptive control with the initial value of the servo variable which is stored in the memory (calibration value at the time of product shipment).

This is a desired feature for the magnetic sensor for which high reliability is required because the magnetic sensor can support a self-diagnosis function which detects a fault in the state where a magnetic sensor is operating after the magnetic sensor is shipped out.

Therefore, the signal processing circuit which has the fault diagnosis function according to the present invention can realize a high reliability in a current sensor which is used for the purpose of detecting a switching current of an inverter or in other magnetic sensor using a Hall element.

Figure 11:
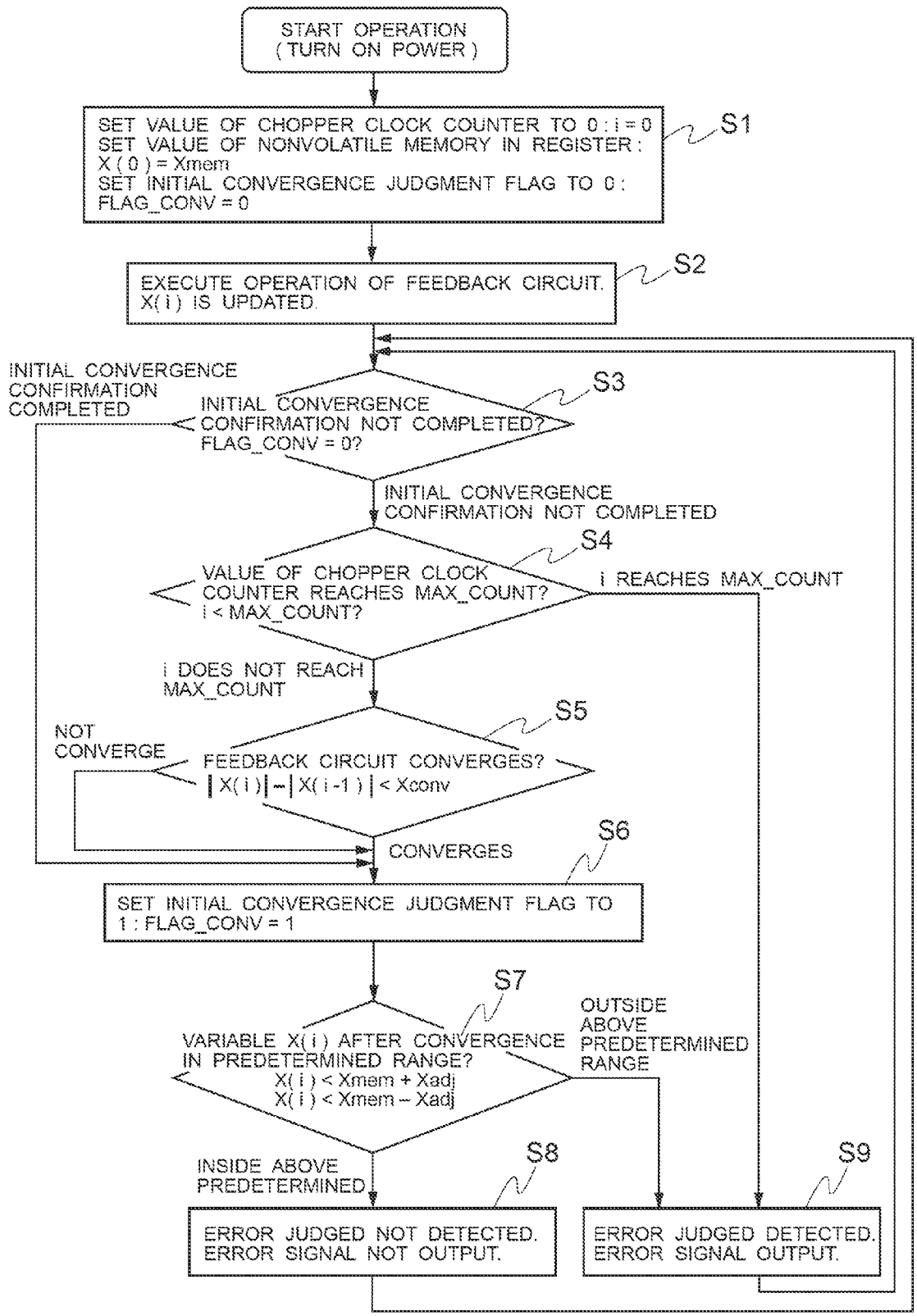
FIG. 11 is a figure which shows a flow chart for explaining the operation of a signal processing circuit which is provided with a fault diagnosis function according to the present invention.

FIG. 11 is a figure which shows a flow chart for explaining the operation of a signal processing circuit which is provided with a fault diagnosis function according to the present invention. That is, it is a flow chart for explaining the self-diagnosis function of a fault in the state where the magnetic sensor is operating.

When the power is turned on and the signal processing circuit of the present invention starts its startup operation, the following operations are carried out.

First, at step S1, the value of the chopper clock counter is initialized to 0. That is, the value "i" of the chopper clock counter is set to 0, the value memorized in the memory is assigned to the servo variable in the N-bit register, setting $X(i)=X(0)=Xmem$. And, regarding the adaptive control of the feedback circuit (servo operation), the binary variable FLAG_CONV which is implemented in the error signal generation circuit of FIG. 6 in order to indicate whether the convergence has been completed or not is initialized to be 0 which indicates that convergence has not been completed. That is, FLAG_CONV=0.

Next, at step S2, the operation of the feedback circuit is started and the value of the servo variable $X(i)$ which is stored in the N-bit register is updated.

Next, at step 3, each time the value of the servo variable X(i) is updated, the value of FLAG_CONV is checked and conditional branch operation is performed. If the value of FLAG_CONV is "1", which indicates that the convergence has been completed, the operations of step S4, step S5, and step S6, steps for checking the time-out of the convergence, are not executed. And then, the next operating step after step S3 becomes step S7. On the other hand, if the value of the FLAG_CONV is "0" which indicates that the convergence has not been completed yet, the next operation after step S3 becomes step S4.

Next, at step S4, the value of "i" of the chopper clock counter is compared with predetermined value MAX_COUNT to judge the convergence at the startup operation and perform conditional branch operation.

Next, at step S4, if the value "i" of the chopper clock counter exceeds the predetermined value MAX_COUNT, it is judged that the convergence has been timed-out at the startup operation, then the signal processing circuit of the present invention issues an error signal to the outside (transition from step S4 to step S9).

Next, at step S5, convergence at the time of startup is judged. As one example of this judgment method, concerning the value of the chopper clock counter, the difference between the value X(i) of the servo variable when the counter value is "i" and the value X(i−1) of the servo variable when the counter value is i−1 can be used as the criteria to make judgment. Specifically, as shown in Formula 15, for the predetermined threshold value Xconv, it is possible to judge the convergence based on whether |X(i)−X(i−1)| has become the threshold value Xconv or less.

Formula expressing the criteria to judge the convergence of the feedback circuit    Formula 15

$$\begin{cases} |X(i) - X(i-1)| \geq Xconv \Rightarrow \text{No converged} \\ |X(i) - X(i-1)| > Xconv \Rightarrow \text{Converged} \end{cases}$$

Next, at step S6, when the judgment based on the above-mentioned judgment method (Formula 15) is that the convergence at the time of startup has been completed, the value of the variable FLAG_CONV is set from the value 0, which indicates that the convergence has not been completed, to the value 1, which indicates that the convergence has been completed. If the convergence in the startup operation is judged to have been completed with the criteria explained above (Formula 15), the value of the variable FLAG_CONV is switched from 0, which indicates that the convergence has not been completed, to 1, which indicates that the convergence has been completed.

Next, at step S7, it is confirmed if the value of the servo variable X(i) of the feedback circuit after convergence is in a predetermined allowable range and a conditional branch operation is executed.

Next, at step S7, if the discrepancy between the value after convergence of the servo variable X(i) and the value Xmem which is stored in the memory is over the range of the predetermined allowable range Xadj, it is judged that there is an abnormality in the offset of the Hall element or an abnormality in the offset of the signal amplification circuit in the magnetic sensor which uses the Hall element and an error signal is issued by the magnetic sensor (transition from step S7 to step S9).

Conversely, at step S7, if the discrepancy between the value after convergence of the servo variable X(i) and the value Xmem which is stored in the memory is in the range of the predetermined allowable range Xadj, it is judged that there is no abnormality in the offset of the Hall element or signal amplification circuit and no error signal is issued from the magnetic sensor (transition from step S7 to step S8).

Regardless of whether or not any abnormality is detected in the above-mentioned operation, the signal processing circuit of the present invention continuously executes the sensor operation of detecting the magnetic field signal as a magnetic sensor (transition from step S8 to step S2 and transition from step S9 to step S2).

So far, referring to FIG. 11, an example of the operation of the fault diagnosis function in the signal processing circuit of the present invention was explained. As is clear from this explanation, the signal processing circuit which has the fault diagnosis function of the present invention can realize a high reliability in a current sensor which is used for the purpose of detecting the switching current of an inverter and also in other magnetic sensors using a Hall element. Moreover, the above-mentioned signal processing circuit which has the fault diagnosis function of the present invention can be utilized as a current sensor.

Moreover, the error signal generation circuit may be provided with a memory update unit which updates the value which is stored in the memory based on the value determined by the adaptive control. That is, after the product shipment, it is possible to write the value of the servo variable X(i) (with the value of "i" here being a large value) which is determined by the operation of the current sensor after the current sensor is mounted on a board into the memory. (Compared with the value obtained by the calibration at the time of shipment, an initial value of the servo variable which fits better to the environmental condition in which the current sensor is in operation is obtained.)

REFERENCE SIGNS LIST

11 Hall element
12 first switch circuit
14 chopper clock generation circuit
100 current sensor
101 Hall element
102 offset component output circuit
103 reference signal generator (cum operating value storage unit; memory)
104 error signal generation circuit
105 feedback circuit
106 signal amplification circuit
107 offset component estimator
131 first transistor differential pair (Gm,1)
132 second switch circuit
133 second transistor differential pair (Gm,2)
134 third switch circuit
135 fourth transistor differential pair (Gm,out)
151 chopper clock counter
153 M-bit AD converter
154 digital integrator
156 selection circuit
157 N-bit register
158 N-bit DA converter
159 third transistor differential pair (Gm,3)

The invention claimed is:
1. A current sensor having a self-diagnosis function comprising:

an offset component output circuit which extracts an offset component by frequency modulation from an output signal of a Hall element including a signal component and an offset component;
a reference signal output unit which outputs a reference signal; and
an error signal generation circuit generating an error signal based on the offset component which the offset component output circuit outputs and the reference signal.

2. A current sensor having a self-diagnosis function according to claim 1, wherein the offset component output circuit comprises a signal amplification circuit which amplifies the output of the Hall element and outputs an output signal obtained by modulating one of the signal component and the offset component to a low frequency component including direct current and the other to a ripple component synchronized with a chopper clock and the offset component output circuit extracts the offset component from the output of the signal amplification circuit.

3. A current sensor having a self-diagnosis function according to claim 2, further comprising a feedback circuit which receives the offset component and feeds back the offset component to the signal amplification circuit.

4. A current sensor having a self-diagnosis function according to claim 3, wherein the feedback circuit controls the offset component based on adaptive control which acts to cancel out the offset component contained in the output signal of the signal amplification circuit.

5. A current sensor having a self-diagnosis function according to claim 3, comprising an operating value storage unit in which values for operating the feedback circuit are stored, wherein the feedback circuit comprises a selection circuit which sets one of the output of the offset component output circuit and the output of the operating value storage unit as the offset component.

6. A current sensor having a self-diagnosis function according to claim 5, wherein the selection circuit sets the output of the operating value storage unit as the offset component at the time of initial operation of the feedback circuit and sets the output of the offset component output circuit as the offset component after the initial operation.

7. A current sensor having a self-diagnosis function according to claim 5, wherein the circuit comprises an operating value update unit which updates the value stored in the operating value storage unit based on the offset component which the offset component output circuit outputs.

8. A current sensor having a self-diagnosis function according to claim 2, wherein the signal amplification circuit outputs an output signal obtained by modulating the signal component to a low frequency component including direct current and the offset component to a ripple component which is synchronized with a chopper clock.

9. A current sensor having a self-diagnosis function according to claim 8, wherein the signal amplification circuit converts a signal, obtained by modulating the offset component to a low frequency component including direct current and the signal component to a ripple component which is synchronized with a chopper clock, to a current signal by a transconductance element, amplifies the signal, and modulates the obtained signal to the chopper clock frequency so as to output an output signal obtained by modulating the signal component to a low frequency component including direct current and the offset component to a ripple component synchronized with the chopper clock.

10. A current sensor having a self-diagnosis function according to claim 9, wherein the circuit is provided with a feedback circuit which receives the offset component and feeds back the offset component to the signal amplification circuit and wherein the feedback circuit converts the offset component to a current signal by a transconductance element, amplifies the signal, and feeds the signal back to the signal amplification circuit.

11. A current sensor having a self-diagnosis function according to claim 8, wherein the offset component output circuit extracts the offset component in the output of the signal amplification circuit by synchronous detection with the chopper clock frequency.

12. A current sensor having a self-diagnosis function according to any one of claim 1, wherein the reference signal output unit is provided with a reference signal storage unit and outputs a reference signal based on a value which is stored in the reference signal storage unit.

13. A current sensor having a self-diagnosis function according to claim 12, wherein the value which is stored in the reference signal storage unit is a value which is obtained by measuring the offset component in advance.

14. A current sensor having a self-diagnosis function according to claim 12, wherein the reference signal storage unit is an OTPROM or EEPROM.

15. A current sensor having a self-diagnosis function according to claim 12, wherein the circuit comprises a reference signal update unit updating the value stored in the reference signal storage unit based on the offset component which the offset component output circuit outputs.

16. A current sensor having a self-diagnosis function according to claim 1, wherein the error signal generation circuit generates an error signal based on results of comparison between the offset component which the offset component output circuit outputs and the reference signal.

17. A current sensor having a self-diagnosis function according to claim 1, wherein the error signal generation circuit generates an error signal based on a ratio of or a difference between the value given by the offset component which the offset component output circuit outputs and the value shown by the reference signal.

18. A current sensor having a self-diagnosis function according to claim 1, wherein the error signal generation circuit performs the comparison between the value of the offset component which the offset component output circuit outputs and the value given by the reference signal using an upper limit value and lower limit value and generates an error signal based on the results of the comparison.

19. A signal processing circuit having a self-diagnosis function comprising:
an offset component output circuit which extracts an offset component by frequency modulation from a signal including a signal component and an offset component;
a reference signal output unit which outputs a reference signal; and
an error signal generation circuit generating an error signal based on the offset component which the offset component output circuit outputs and the reference signal.

* * * * *